US006288591B1

(12) United States Patent
Riccio

(10) Patent No.: US 6,288,591 B1
(45) Date of Patent: Sep. 11, 2001

(54) LEVEL SHIFTER FOR MULTIPLE SUPPLY VOLTAGE CIRCUITRY

(75) Inventor: Roberta Burger Riccio, Munich (DE)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/473,366

(22) Filed: Dec. 28, 1999

(30) Foreign Application Priority Data

Dec. 29, 1998 (IT) .............................................. MI98A2844

(51) Int. Cl.[7] ....................................................... H03L 5/00
(52) U.S. Cl. .............................. 327/333; 327/259; 326/81
(58) Field of Search ........................ 326/80, 81; 327/239, 327/259, 295, 318, 319, 333

(56) References Cited

U.S. PATENT DOCUMENTS

| | | | | |
|---|---|---|---|---|
| 5,455,526 | * | 10/1995 | Runas | 326/81 |
| 5,461,333 | * | 10/1995 | Condon et al. | 327/208 |
| 5,495,189 | * | 2/1996 | Choi | 326/97 |
| 5,510,731 | * | 4/1996 | Dingwall | 326/63 |
| 5,528,173 | * | 6/1996 | Merritt et al. | 326/80 |
| 5,680,064 | * | 10/1997 | Masaki et al. | 326/81 |
| 5,834,948 | * | 11/1998 | Yoshizaki et al. | 326/81 |
| 5,952,865 | * | 9/1999 | Rigazio | 327/333 |
| 5,973,549 | * | 10/1999 | Yuh | 327/541 |
| 6,002,290 | * | 12/1999 | Avery et al. | 327/333 |
| 6,133,752 | * | 10/2000 | Kawagoe | 326/55 |

* cited by examiner

*Primary Examiner*—Jeffrey Zweizig
(74) *Attorney, Agent, or Firm*—Theodore E. Galanthay; Robert Iannucci; Seed IP Law Group, PLLC

(57) ABSTRACT

A voltage level shifter and an associated level shifting method for shifting from a low voltage input signal to a high voltage output signal are discussed. The level shifter includes a voltage shifting stage having first and second control input nodes and an output node at which the output signal is produced based on control signals received at the control input nodes. The level shifter also includes first and second input inverters coupled in series between the input node and the first control input node; and a third input inverter coupled between the input node and the second control input node. The second inverter can include complementary first and second transistors each with control terminals coupled to an output of the first inverter. The first transistor has a first terminal coupled to the input node and is structured to pass the input signal to the first control input node based on a logic value of a signal output by the first inverter. The third inverter can include complementary third and fourth transistors each with control terminals coupled to the input node. The third transistor has a first-t terminal coupled to the output of the first inverter-and is structured to pass the signal output by the first inverter to the second control input node based on a logic value of the input signal.

11 Claims, 3 Drawing Sheets

LEVEL SHIFTER FOR MULTIPLE SUPPLY VOLTAGE CIRCUITRY

TECHNICAL FIELD

The present invention relates in general to multiple supply voltage integrated circuits. More in particular, the present invention relates to interface circuitry between networks biased at different voltage levels.

BACKGROUND OF THE INVENTION

Many electrical circuits are composed of multiple functional units, in which the supply voltage of each functional unit is adjusted in order to minimize the overall system-level power consumption. To interface between those blocks, a voltage level shifter is employed to switch between the voltage levels of the respective functional blocks. Although level shifters can shift from low to high voltage or from high to low voltage, the following discussion focuses on the former type.

It should be appreciated that the terms "low voltage" and "high voltage" are used herein in their relative senses without limiting them to actual values, that is, "low" is simply low relative to "high." For example, a "low" voltage may have a voltage level at logic low of less than 0.7 V and a voltage level at logic high of 2.5V while a "high" voltage may have a voltage level at logic 0 of less than 1.0V and a voltage level at logic high of greater than 5V. Other values are certainly contemplated and are within the general scope of the present invention.

In order to simplify the system layout, a level shifter can be thought of as divided into two parts: a sender and a receiver. The sender is the input section of the level shifter and works at low voltage and the receiver is the output section and works at high voltage. In this way, suppose a block A works with low voltage, and a block B works with high voltage. The layout or block A would include the sender portion of a level shifter and the layout or block B would include the receiver portion of the level shifter.

FIG. 1 shows a well known circuit implementation of a voltage level shifter 10. The level shifter 10 includes an input terminal 11 that receives a low voltage input signal INP and an input inverter 12 that inverts the input signal to produce a complementary input signal INP_INV. Respectively connected to the input terminal 11 and the output of the input inverter 12 are gate terminals of first and second NMOS transistors MN1, MN2, both of which have source terminals coupled to ground. The second NMOS transistor also has a drain terminal that acts as an output terminal 13. Respectively connected in series to drain terminals of the first and second NMOS transistors MN1, NN2 are drain terminals of cross-coupled first and second PMOS transistors MP1, MP2, both of which have source terminals coupled to a high voltage supply reference. The first and second PMOS transistors are cross-coupled in that a gate terminal of the first PMOS transistor MP1 is coupled to the drain terminal of the second PMOS transistor MP2, which has a gate terminal coupled to the drain terminal of the first PMOS transistor MP1. The first and second NMOS and PMOS transistors MN1, MN2, MP1, MP2 together comprise a level shifting stage 14. The capacitances C1, C2 shown in FIG. 1 are wire capacitances of the line connecting the input node to the first NMOS transistor MN1 and the line connecting the input inverter 12 to the second NMOS transistor MN2, respectively.

The level shifter 10 converts the low voltage input signal INP at the input node 11 to a high voltage output signal OUT at the output node 13 as follows. When the input signal is logic low, the first NMOS transistor MN1 is "off" and the second NMOS transistor MN2 is "on" via the input inverter 12. As a result, the second NMOS transistor electrically connects the output node 13 to ground which drives the output signal OUT to logic low. Further, the logic low output signal OUT turns "on" the first PMOS transistor which provides the high voltage supply reference to the gate terminal of the second PMOS transistor, which thereby is held "off."

When the input signal INP goes high, the first NMOS transistor MN1 is turned "on" and the second NMOS transistor MN2 is turned "off." Turning "on" the first NMOS transistor electrically connects to ground the gate terminal of the second PMOS transistor MP2, which thereby is turned "on" and provides the high voltage supply reference to the output node 13.

It will be appreciated that the first NMOS transistor MN1 will turn "on" before the second NMOS transistor MN2 will turn "off" because of the delay introduced by the input inverter 12. This causes a short circuit current to flow between the high voltage supply reference and ground via the NMOS and PMOS transistors MN1, MP1. Because the first NMOS transistor MN1 is stronger than the first PMOS transistor MP1, the second PMOS transistor MP2 will be switched "on", causing a second short current to flow via the second NMOS and PMOS transistors MN2, MP2. These short circuit currents flow until the second NMOS transistor MN2 is turned "off" by the input inverter 12, which allows the second PMOS transistor MP2 to turn "off" the first PMOS transistor MP1.

The mismatch in arrival times of the input signal INP and its complement INP_INV to the NMOS transistors MN1, MN2 can be exacerbated by large wire capacitances C1, C2 and by differences in the wire capacitances C1, C2. Such differences in the wire capacitances C1, C2 can occur if the lines to the NMOS transistors MN1, MN2 are wired differently. Such wire capacitances C1, C2 typically do differ considerably because the sender and receiver portions of the level shifter typically are implemented in separate low voltage and high voltage wells of a semiconductor substrate. The bigger the capacitance values C1, C2, or their mismatch, or the eventual crosstalk effect, the longer the short circuit currents flow and more power is consumed. The added short circuit currents caused by the capacitive differences wastes energy and can cause serious power dissipation problems.

SUMMARY OF THE INVENTION

An embodiment of the invention is directed to a voltage level shifter and an associated level shifting method for shifting from a low voltage input signal to a high voltage output signal. The level shifter includes a voltage shifting stage having first and second control input nodes and an output node at which the output signal is produced based on control signals received at the control input nodes. The level shifter also includes first and second input inverters coupled in series between the input node and the first control input node; and a third input inverter coupled between the input node and the second control input node.

The second inverter can include complementary first and second transistors each with control terminals coupled to an output of the first inverter. The first transistor has a first terminal coupled to the input node and is structured to pass the input signal to the first control input node base, on a logic value of a signal output by the first inverter. The third inverter can include complementary third and fourth transistors each with control terminals coupled to the input node. The third transistor has a first terminal coupled to the output of the first inverter and is structured to pass the signal output by the first inverter to the second control input node based on a logic value of the input signal.

DETAILED DESCRIPTION

Figure 1:
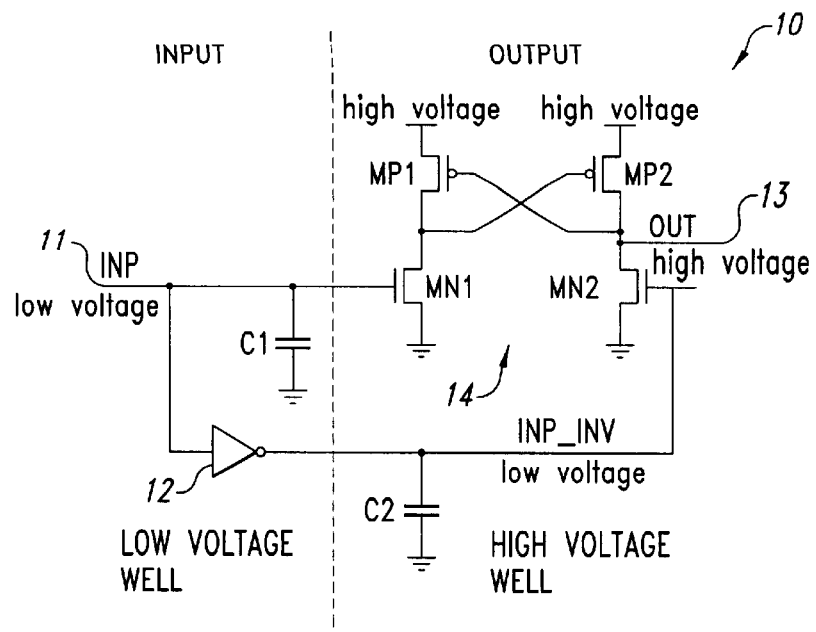
FIG. 1 is a circuit diagram of a prior art voltage level shifter.
Figure 2:
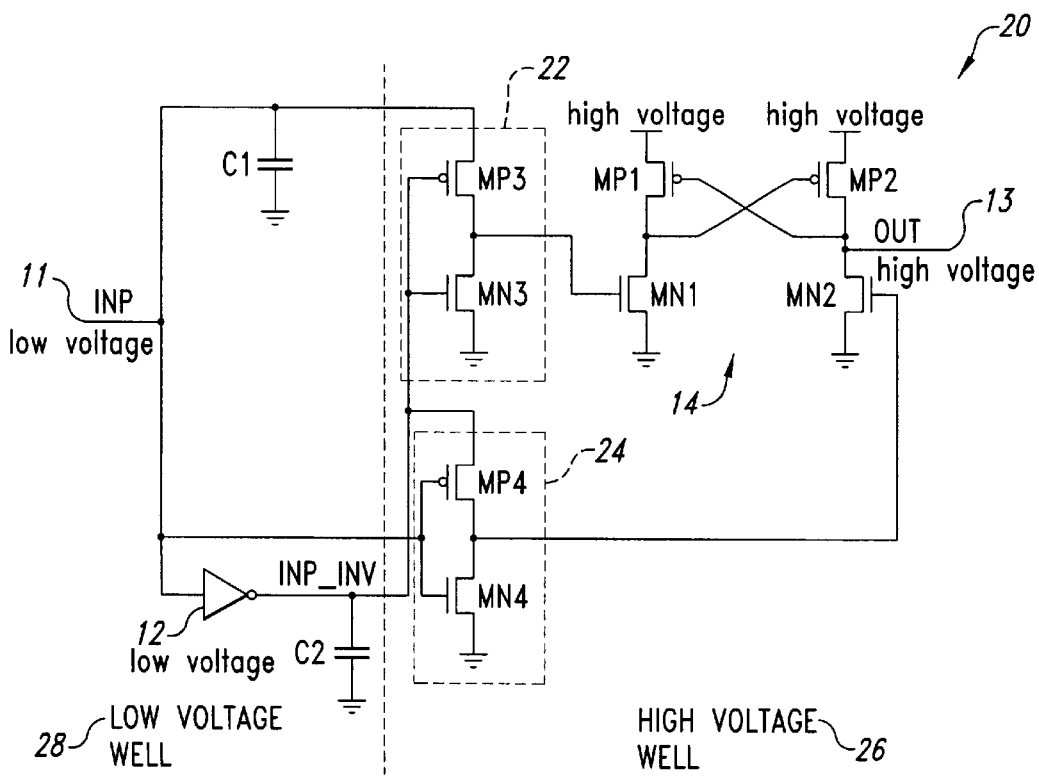
FIG. 2 is a circuit diagram of a voltage level shifter according to an embodiment of the present invention.

A voltage level shifter 20 according to an embodiment of the present invention is shown in FIG. 2. The level shifter 20 includes several elements substantially identical to corresponding elements of the prior art level shifter 10, and thus, the elements are labeled in FIG. 2 the same as in FIG. 1.

The level shifter 20 of FIG. 2 differs from the level shifter 10 of FIG. 1 in that the level shifter 20 includes a first inverter 22 coupled between an output of the input inverter 12 and the first NMOS transistor MN1 and a second inverter 24 coupled between the input node 11 and the second NMOS transistor MN2. The first and second inverters 22, 24 are structured to compensate for skews that would otherwise occur because of differences in the wiring capacitances C1, C2.

The first inverter 22 includes a third NMOS transistor MN3 connected in series with a third PMOS transistor MP3 between ground and the input node 11. The third NMOS transistor MN3 has a gate terminal coupled to the output of the input inverter 12, a source terminal coupled to ground, and a drain terminal coupled to the gate terminal of the first NMOS transistor MN1. The third PMOS transistor MP3 has a gate terminal coupled to the output of the input inverter 12, a source terminal coupled to the input node 11, and a drain terminal coupled to the gate terminal of the first NMOS transistor MN1.

The second inverter 24 includes a fourth NMOS transistor MN4 connected in series with a fourth PMOS transistor MP4 between ground and the input node 11. The fourth NMOS transistor MN4 has a gate terminal coupled to the input terminal 1, a source terminal coupled to ground, and a drain terminal coupled to the gate terminal of the second NMOS transistor MN2. The fourth PMOS transistor MP4 ahs a gate terminal coupled to the input node 11, a source terminal coupled to the output of the input inverter 12, and a drain terminal coupled to the gate terminal of the first NMOS transistor MN1.

When the input signal INP at the input node 11 is logic low, the third NMOS transistor MN3 is "on" via the input inverter 12 and the fourth PMOS transistor MP4 is "on" via the input signal at its gate terminal. As a result, the gate of the first NMOS transistor NN1 is coupled to ground and the first NMOS transistor MN1 is "off". Also, the fourth PMOS transistor MP4 transfers the complement input signal INP_INV from the output of the input inverter 12 to the gate of the second NMOS transistor MN2. This turns "on" the second NMOS transistor MN2, which connects the output node to ground and drives the output signal OUT to a logic low level.

When the input signal INP switches to logic high, the fourth PMOS transistor MP4 is turned "off" and the fourth NMOS transistor MN4 is turned "on". This connects the gate of the second NMOS transistor MN2 to ground and thereby turns it "off". Also, the input inverter 12 switches the complement input signal INP_INV to logic low, which turns "off" the third NMOS transistor MN3 and turns "on" the third PMOS transistor MP3. The third PMOS transistor MP3 transfers the logic high input signal INP to the gate of the first NMOS transistor MN1, thereby turning it "on". The first NMOS transistor MN1 responds by turning "on" the second PMOS transistor MP2, which drives the output signal OUT to a high voltage logic high.

It will be appreciated that the inclusion of the first and second inverters 22, 24 almost entirely eliminates the short circuit currents that were present in the prior art level shifter 10 during switching from a logic low input signal to a logic high. That is because the input signal INP cannot turn "on" the first NMOS transistor MN1 until the input inverter 12 switches the complement input signal INP_INV to a logic low which turns "on" the third PMOS transistor MP3. By that time, the input signal INP has turned "on" the fourth NMOS transistor MN4, which turns "off" the second NMOS transistor MN2 and prevents a short circuit current from developing through the second PMOS transistor MP2 and the second NMOS transistor MN2. It is possible that a short circuit current may develop briefly through the first PMOS transistor MP1 and the first NMOS transistor MN1 when the first NMOS transistor MN1 is turned "on", but that current will be quickly ended by the second PMOS transistor MP2 turning "off" the first PMOS transistor MP1 without waiting for any inverter delay.

A similar elimination or reduction in the duration of short circuit currents occurs when the input signal INP switches back to logic low. The logic low input signal INP turns "off" the fourth NMOS transistor MN4 and turns "on" the fourth PMOS transistor MP4. As soon as the input inverter 12 switches the complement input signal INP_INV to logic high, the second NMOS transistor MN2 is turned "on", the output signal OUT goes to logic low, and the first PMOS transistor MP1 is turned "off". While that is occurring, the complement input signal INP_INV turns "off" the third NMOS transistor MN3 and turns "on" the third PMOS transistor MP3. This transfers the input signal INP to the gate of the first NMOS transistor MN1, thereby turning it "on" and turning "off" the second PMOS transistor MP2.

During the brief time that the input signal INP and its complement INP_INV are both logic low (before the input inverter 12 has enough time to switch), the third PMOS transistor MP3 transfers the input signal INP to the gate of the first NMOS transistor MN1, which turns it "off". As a result, no short circuit current is allowed to develop in the first NMOS transistor MN1 during that period. When the input inverter 12 switches the complement input signal INP_INV to logic high, the third NMOS transistor MN3 is turned "on", which keeps the first NMOS transistor MN1 turned "off". Again while the input signal INP and its complement INP_INV are both logic low, the fourth PMOS transistor MP4 transfers the complement input signal INP_ INV to the second NMOS transistor MN2, thereby turning it "off" and preventing a short circuit current from developing through the second PMOS transistor MP2 and the second NMOS transistor MN2. When the input inverter 12 switches the complement input signal INP_INV to logic high, the fourth PMOS transistor MP4 tuns the second NMOS transistor MN2 back "on". A very brief short circuit current could start to develop through the second NMOS transistor MN2, but it will be extinguished very quickly by the first NMOS transistor MN1 turning "off" the second PMOS transistor MP2.

Figure 3:
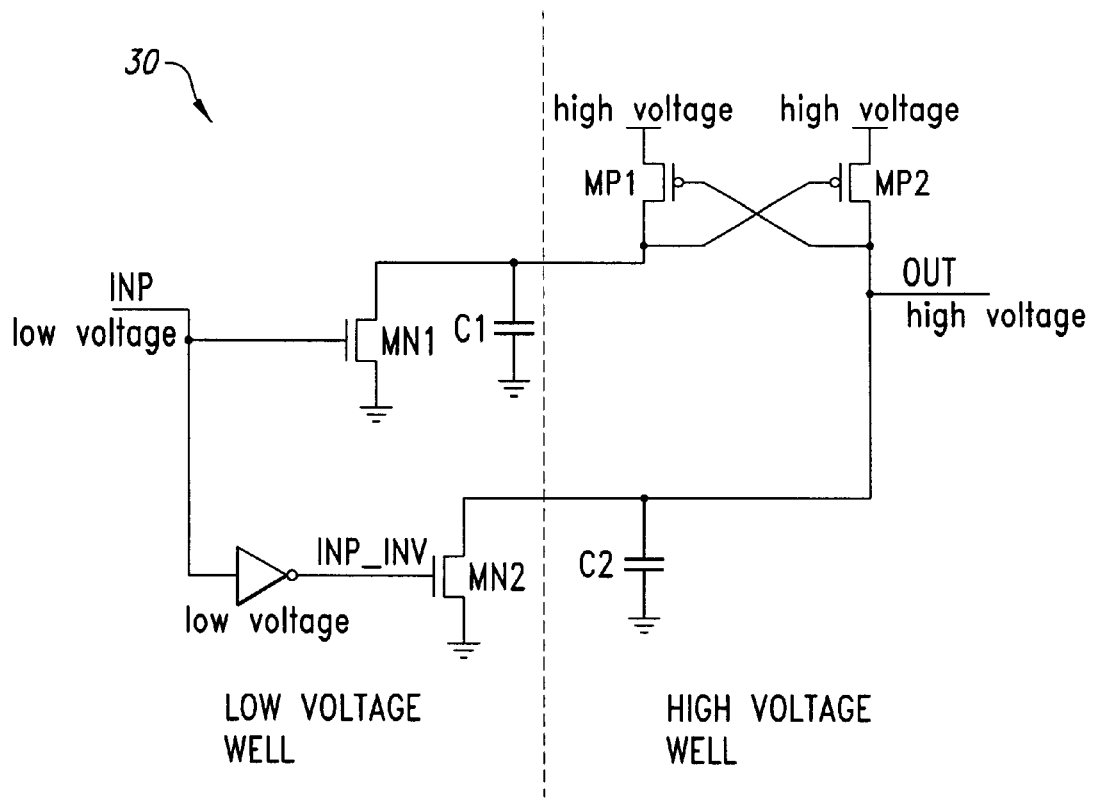
FIG. 3 is a circuit diagram of a proposed voltage level shifter.

In order to further reduce the possibility of short circuit currents developing, the first and second inverters 22, 24 are implemented in high voltage well 26 of a semiconductor substrate along with the level shifting stage 14 and the input terminal 11 and input inverter 12 are implemented in a low voltage well 28 of the same semiconductor substrate. That allows the drains of the first and second inverter transistors MN3, MN4, MP3, MP4 to be positioned as close as possible to the gates of the first and second NMOS transistors MN1, MN2. That closeness enables the level shifter 20 to avoid significant skews on the signals received by the first and second NMOS transistors MN1, MN2. In contrast the signals received by the gates of the first and second NMOS transistors MN1, MN2 in the prior art level shifter 10 come from a separate well in which the input node 11 and the input inverter 12 are implemented. Accordingly, the signals at the gates of the first and second NMOS transistors MN1, MN2 in the prior art level shifter 10 inherently will have a greater skew than those in the level shifter 20 according to the present invention, The applicant investigated another possible solution to the short circuit problems of the prior art level shifter 10, which is shown in FIG. 3 as a level shifter 30. Rather than employing additional first and second inverters 22, 24 as in the level shifter 20, the level shifter 30 of FIG. 3 simply implements the first and second NMOS transistors MN1, MN2 in a low voltage well 32 while leaving the first and second PMOS transistors MP1, MP2 in a high voltage well. The thought was that moving the first and second NMOS transistors MN1, MN2 closer to the input terminal 11 and the input inverter 12 would reduce the wire capacitances on the lines coupled to the gates of the first and sec and NMOS transistors MN1, MN2 and thereby reduce the duration of the short circuit currents.

In reality, the level shifter 30 of FIG. 3 results in worse short circuit power usage than even the prior art level shifter 10 of FIG. 1. The poor short circuit power usage appears to be caused by large wiring capacitances C1, C2 that are shifted from the gates of the first and second NMOS transistors MN1, MN2 to their drains.

Figure 4A:
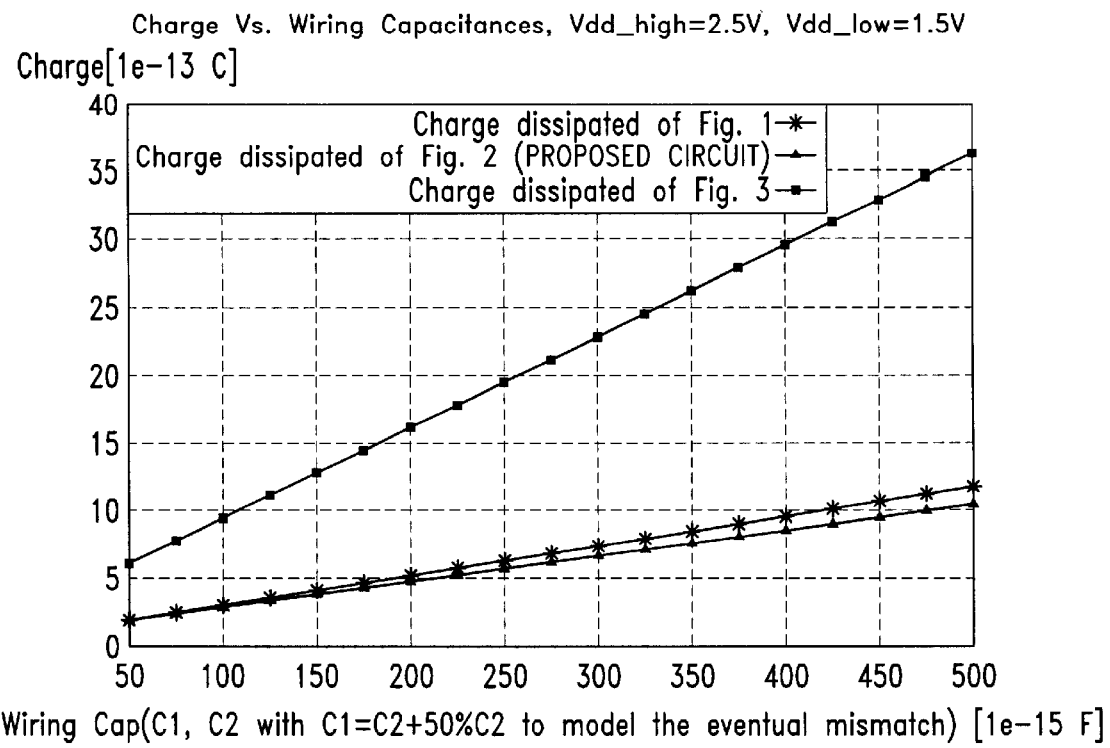
FIGS. 4A and 4B are graphs of electric charge versus wiring capacitance for the level shifters shown in FIGS. 1–3.
Figure 4B:
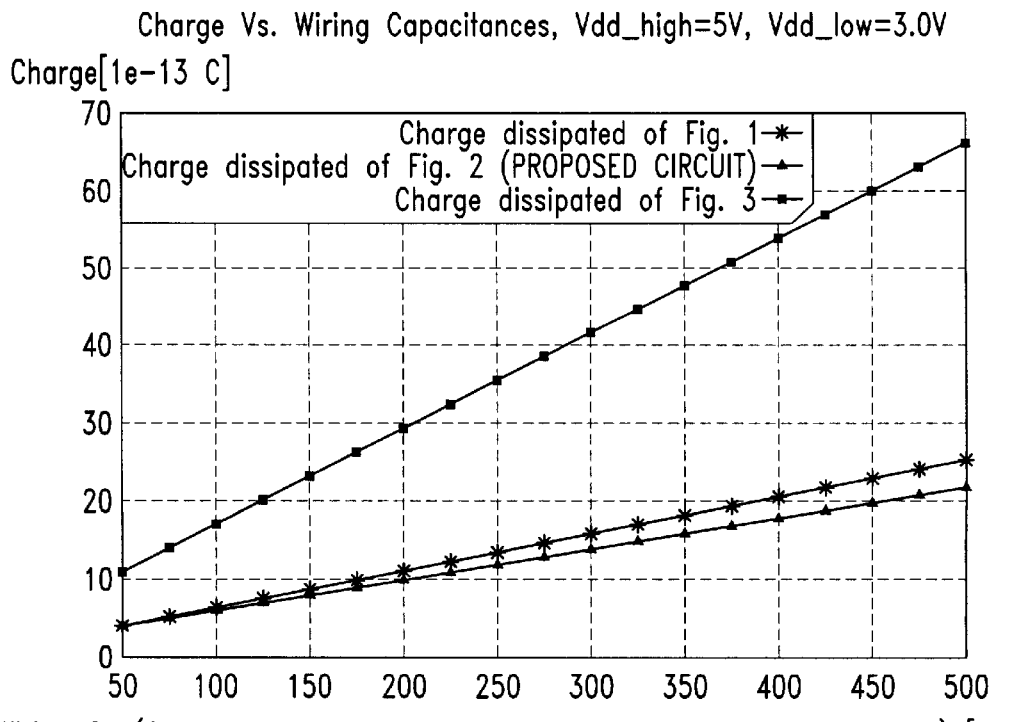

Comparisons of the charge dissipated by each of the level shifters 10, 20, 30 can be found in FIGS. 4A and 4B. It can be seen that the charge dissipated increases linearly with the size of the wire capacitances, with the charge dissipated by the level shifter 30 being the greatest of the three level shifters. It is also apparent that the charge dissipated by the prior art level shifter 10 of FIG. 1 increases with wire capacitances at a faster rate than the level shifter 20 of FIG. 2. One may note even at a wire capacitance of 500 fF, the difference in charge dissipated between the prior art level shifter 10 and the level shifter 20 is only about 50 pC. However, if we consider that a larger number of level shifters (e.g., 100,000 or more) may need to be implemented in the same chip and that an operating frequency in excess of 100 Mhz may be applied, the power saving achieved is definitely significant for low power applications. The level shifter 20 would be beneficial in almost any digital circuit although the power savings can best be appreciated in large digital circuits, such as video transmission circuits (MPEG), viterbi encoders, etc.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A voltage level shifter, comprising:
   a voltage shifting stage having first and second control input nodes, and an output node at which a high voltage output signal is produced based on control signals received at the control input nodes;
   an input node receiving a low voltage input signal;
   first and second input inverters coupled in series between the input node and the first control input node; and
   a third input inverter coupled between the input node and the second control input node, wherein the third inverter includes complementary first and second transistors each with control terminals coupled directly to the input node, the first transistor having a first terminal coupled to an output of the first inverter and being structured to pass a signal output by the first inverter to the second control input node based on a logic value of the input signal.

2. The level shifter of claim 1 wherein the second inverter includes complementary third and fourth transistors each with control terminals coupled to the output of the first inverter, the third transistor having a first terminal coupled to the input node and being structured to pass the input signal to the first control input node based on a logic value of a signal output by the first inverter.

3. The level shifter of claim 1 wherein the voltage shifting stage includes a first output transistor coupled between a first voltage reference and the output node and a second output transistor coupled between a second voltage reference and the output node.

4. The level shifter of claim 3 wherein the voltage shifting stage also includes first and second control transistors series coupled between the first and second voltage references; the first control transistor having a control terminal coupled to the output node, a first terminal coupled to the first voltage reference, and a second terminal coupled to a control terminal of the first output transistor; the second control transistor having a control terminal acting as a first one of the first and second control inputs, a first terminal coupled to the second terminal of the first control transistor, and a second terminal coupled to the second voltage reference; and the second output transistor having a control terminal acting as a second one of the first and second control inputs, a first terminal coupled to the output node, and a second terminal coupled to the second voltage reference.

5. A voltage level shifter, comprising:
   a voltage shifting stage having first and second control input nodes, and an output node at which a high voltage output signal is produced based on control signals received at the control input nodes;
   an input node receiving a low voltage input signal;
   first and second input inverters coupled in series between the input node and the first control input node; and
   a third input inverter coupled between the input node and the second control input node, wherein the first inverter is implemented in a first well of a semiconductor and the second and third inverters are implemented with the voltage shifting stage in a second well of the semiconductor.

6. A voltage level shifter, comprising:
   a voltage shifting stage having a first and second control input nodes, and an output node at which a high voltage output signal is produced based on control signals received at the control input nodes;

first and second input nodes for receiving a low voltage input signal and a low voltage complement input signal, respectively, the complement input signal being complementary with respect to the input signal;

a first transfer gate coupled to the first and second input nodes and to the first control input node of the voltage shifting stage, the first transfer gate passing the low voltage input signal to the first control input node under control of the complement low voltage input signal; and a second transfer gate coupled to first and second input nodes and to the second control input node of the voltage shifting stage, the second transfer gate passing the complement low voltage input signal to the second control input node under control of the low voltage input signal, wherein the second transfer gate includes complementary first and second transistors each with control terminals coupled directly to the first input node, the first transistor having a first terminal coupled to the second input node and being structured to pass the complementary input signal to the second control input node based on a logic value of the input signal.

7. The level shifter of claim 6 wherein the first transfer gate is a pull-up transistor of a first inverter and the second transfer gate is a pull-up transistor of a second inverter.

8. The level shifter of claim 6 wherein the first transfer gate includes complementary third and fourth transistors each with control terminals coupled to the second input node, the third transistor having a first terminal coupled to the first input node and being structured to pass the input signal to the first control input node based on a logic value the complementary input signal.

9. The level shifter of claim 6 wherein the voltage shifting stage includes a first output transistor coupled between a first voltage reference and the output node and a second output transistor coupled between a second voltage reference and the output node.

10. The level shifter of claim 9 wherein the voltage shifting stage also includes first and second control transistors series coupled between the first and second voltage references; the first control transistor having a control terminal coupled to the output node, a first terminal coupled to the first voltage reference, and a second terminal coupled to a control terminal of the first output transistor; the second control transistor having a control terminal acting as a first one of the first and second control inputs, a first terminal coupled to the second terminal of the first control transistor, and a second terminal coupled to the second voltage reference; and the second output transistor having a control terminal acting as a second one of the first and second control inputs, a first terminal coupled to the output node, and a second terminal coupled to the second voltage reference.

11. A voltage level shifter, comprising:

a voltage shifting stage having a first and second control input nodes, and an output node at which a high voltage output signal is produced based on control signals received at the control input nodes;

first and second input nodes for receiving a low voltage input signal and a low voltage complement input signal, respectively, the complement input signal being complementary with respect to the input signal;

a first transfer gate coupled to the first and second input nodes and to the first control input node of the voltage shifting stage, the first transfer gate passing the low voltage input signal to the first control input node under control of the complement low voltage input signal;

a second transfer gate coupled to first and second input nodes and to the second control input node of the voltage shifting stage, the second transfer gate passing the complement low voltage input signal to the second control input node under control of the low voltage input signal; and an inverter coupled between the first input node and the second input node to produce the complementary input signal from the input signal, the inverter being implemented in a first well of a semiconductor and the first and second transfer gates are implemented with the voltage shifting stage in a second well of the semiconductor.

* * * * *